United States Patent [19]

Yasuda et al.

[11] Patent Number: 4,510,441

[45] Date of Patent: Apr. 9, 1985

[54] ELECTRIC FIELD DETECTOR

[75] Inventors: Tomio Yasuda, Kasukabe; Toshiyuki Ichiyama, Higashimine, both of Japan

[73] Assignee: Kabushiki Kaishi Meidensha, Japan

[21] Appl. No.: 388,477

[22] Filed: Jun. 14, 1982

[30] Foreign Application Priority Data

Jun. 12, 1981 [JP] Japan .................................. 56-90537
Jun. 15, 1981 [JP] Japan .................................. 56-91914

[51] Int. Cl.³ .......................................... G01R 31/00
[52] U.S. Cl. ..................................... 324/96; 324/415; 350/356
[58] Field of Search ................. 324/96, 457, 424, 421, 324/418, 415; 340/638, 644, 657; 350/356, 389, 384, 392; 73/105

[56] References Cited

U.S. PATENT DOCUMENTS

| | | | |
|---|---|---|---|
| 3,324,393 | 6/1967 | Casey et al. | 324/96 |
| 3,363,174 | 1/1968 | Hudson et al. | 350/392 |
| 3,403,297 | 9/1968 | Crouch . | |
| 3,411,038 | 11/1968 | Lee . | |
| 3,466,541 | 9/1969 | Bernard et al. . | |
| 3,594,754 | 7/1971 | Voshall . | |
| 3,744,045 | 7/1973 | Frink et al. . | |
| 4,010,632 | 3/1977 | Slezinger et al. . | |
| 4,021,702 | 5/1977 | Rummrott . | |
| 4,034,264 | 7/1977 | Muller et al. . | |
| 4,096,366 | 6/1978 | Titus . | |
| 4,103,291 | 7/1978 | Howe et al. . | |
| 4,163,130 | 7/1979 | Kubota et al. . | |
| 4,398,187 | 8/1983 | Fukushima et al. | 340/638 |
| 4,402,224 | 9/1983 | Fukushima | 73/705 |

FOREIGN PATENT DOCUMENTS

| | | |
|---|---|---|
| 36760 | 9/1981 | European Pat. Off. . |
| 1256568 | 12/1967 | Fed. Rep. of Germany . |
| 1283363 | 11/1968 | Fed. Rep. of Germany . |
| 2002685 | 3/1971 | Fed. Rep. of Germany . |
| 2510545 | 9/1976 | Fed. Rep. of Germany . |
| 2341074 | 10/1976 | Fed. Rep. of Germany . |
| 2516619 | 10/1976 | Fed. Rep. of Germany . |
| 2903838 | 8/1980 | Fed. Rep. of Germany . |
| 1238515 | 7/1971 | United Kingdom . |
| 2040489 | 8/1980 | United Kingdom . |
| 2068137 | 8/1981 | United Kingdom . |

OTHER PUBLICATIONS

C. F. Buhrer et al, "Electrooptic Effect in Optically Active Crystals", *Applied Optics*, vol. 3, No. 4, pp. 517–521.

Primary Examiner—Stewart J. Levy
Attorney, Agent, or Firm—Lowe, King, Price & Becker

[57] ABSTRACT

An electric field detector which comprises means for generating a linearly polarized light, a polarizing element including a Pockels cell made from a Z-cutting quartz which transmits the polarized light toward a Z-direction and changes the phase difference of two light components of a crystal in response to the magnitude of the electric field strength. The electric field detector of the invention can be widely used in measuring conditions of an electrical machine.

11 Claims, 14 Drawing Figures

ELECTRIC FIELD DETECTOR

FIELD OF THE INVENTION

The present invention relates to an electric field detector and, more particularly is concerned with an electric field detector using a photoelectric connecting element for converting optical energy to electrical energy.

BACKGROUND OF THE INVENTION

In recent years, various kinds of electric field detectors have been put into practical use. Particularly, there is widely used in such detectors a photoelectric converting element. An electric field detector of this kind can be used in various monitoring devices and the like. The assignee of the present applicants has also proposed a pressure responsive monitoring device for vacuum type electrical apparatus as a monitoring device for measuring the vacuum pressure of a vacuum circuit interrupter.

In vacuum type devices it is required to monitor the vacuum pressure in order to maintain the preferred superior dielectric characteristics of vacuum for use in power interrupting devices, as opposed to the use of special arc extinguishing materials, such as gases and liquids. Since vacuum offers a dielectric strength with a high voltage recovery rate, interruption can normally be anticipated at the first current zero in an A.C. current waveform. Further, a short contact gap can perform the interruption of current. The short gap provides a low mechanical shock.

Normally, the operating sequence of the vacuum circuit interrupter from a fault to a clear may be accomplished in less than three cycles. Since energy dumped into a fault is proportional to time, the faster cleaning action means less damage, lower contact erosion, longer maintenance free contact life, and maximum equipment protection. An important problem in the vacuum type electrical devices is that the characteristics of the devices are affected by the vacuum pressure. Namely, the problem with the use of vacuum circuit interrupters is that if there is a loss of vacuum as by leakage of air through a crack caused by undue mechanical stress, both the high dielectric strength of the vacuum dielectric and the rapid recovery rate are lost. The small contact spacing will no longer be able to sustain the high voltages. Arcs and flashovers will occur. The white arc will burn the electrode and melt the envelope, and may even extend into and attack other parts of the interrupter assembly.

In recent years, various kinds of pressure measuring systems for vacuum type electric apparatus such as the vacuum circuit interrupters have been put into practical use. As one of the pressure measuring apparatus, a pressure responsive measuring device has been proposed in copending U.S. application Ser. No. 246,617 by T. Fukushima for Pressure Responsive Monitoring Device for Vacuum Circuit Interrupters, filed Mar. 23, 1981, and in copending U.S. application Ser. No. 267,331 by Fukushima et al. for Pressure Monitoring System for a Vacuum Circuit Interrupter, filed May 26, 1981. The pressure responsive measuring device employs an electric field detecting member for detecting the change of electric field strength of the vacuum type electric device corresponding to the change of vacuum pressure.

The electric field detector of FIG. 1 comprises an electric field generating member 100 to be tested, a light source 50 for generating light, an electric field detecting member 60 for detecting electric field and for converting variation of the electric field strength to optical energy variation responsive to the electric strength, a photoelectric converting member 70 for converting optical energy to electrical energy supplied from the electric field detecting member and a discriminating circuit 80 outputting an electric signal.

The light source 50 is provided with a light emitting diode generating light in accordance with electric current flowing thereto. The electric field detecting member 60 is disposed on and/or in the vicinity of an electric field generating member. The electric field detecting member 60 is interconnected with the light source 50. The electric field detecting member 60 comprises a polarizer 62, an electric field sensitive element in the form of a Pockels cell 64 and an analyzer 66. The Pockels cell 64 is arranged between polarizer 62 and the analyzer 66. The analyzer 66 is connected to the photoelectric converting member 70. The vacuum pressure change discriminating member 80 is electrically connected to the photoelectric converting member 70, and an electrical output signal is employed as an alarm signal, an indicating signal and the like.

In the electric field detector of FIG. 1, the light produced by the light source 50 is a random polarized light 52. The random polarized light 52 is supplied to the electric field detecting member 60. In the electric field detecting member 60, the random light is polarized by the polarizer 62 to produce a linearly polarized light having a direction of polarization which is represented by an arrow. The linearly polarized light is applied to the Pockels cell 64. An electric signal in the form of electric field strength E is applied to the Pockels cell 64 from the electric signal generating member 100. The Pockels cell 64 causes the direction of polarization to change. The anaylzer 66 is provided such that its plane of polarization is perpendicular with respect to the optical axis. The electric field strength to be applied to the Pockels cell 64 is determined by the electric field strength. The light from the Pockels cell 64 is dependent upon the electric field strength E and is supplied to the analyzer 66.

In the electric field detector of the prior art, the Pockels cell is, generally, made from a material which is made of a potassium dihydrogenphosphate ($KH_2PO_4$), so called KDP, or an ammonium dihydrogenphosphate ($NH_4H_2PO_4$), so called ADP. Since the ADP and the KDP have large dielectric constants which are ten times that of a quartz, the electric distribution field is disturbed thereby and deviations appear in the measured electric field strength. Additionally, the ADP and the KDP are deliquence and expensive.

Quartz may be used as the Pockels cell which has the low dielectric constant. When quartz is used as the Pockels cell, correct measurement can be obtained since the electric field distribution is not so disturbed, as well as the quartz has the constant light energy loss and has no deliquence. Quartz has, however, a natural double refraction so that the polarizing plane is rotated regardless of the electric field strength, when the linearly polarized light is injected to the quartz in the optical axis direction. Furthermore, quartz is inadequate to satisfy the requirements for accuracy and reliability of the electric field detector, because the double refraction is dependent upon the thermal characteristics.

In order to avoid the defects of quartz, the Pockels cell can be made by coupling two quartz elements in series and in an air-tight configuration, each of which has the symmetrical double refraction such that the natural double refraction is eliminated. The quartz is generally cut by 45°−Z cut and, therefore, the thermal characteristics of the polarizing plane is not good, as shown in FIGS. 4 and 5. In the phase Pockels cell, phase difference of the two specific oscillations of the polarizing plane is proportional to the electric field strength and to the length of element of the optical path direction. Furthermore, it is difficult to manufacture the Pockels cell, because high accuracy is required in order to adhere the two quartz elements such that an air layer is not formed therebetween and so that an optical defect does not exist.

OBJECT OF THE INVENTION

It is an object of the present invention to provide an improved electric field detector for detecting electric field strength of electrical machinery.

It is a further object of the present invention to provide an electric field detector which operates highly reliably and in high performance.

It is an object of the present invention to provide an improved pressure responsive monitoring device for a vacuum typed electric apparatus by means of using an electric field detector.

It is also an object of the present invention to provide a pressure responsive monitoring device for a vacuum type electrical apparatus which operates highly reliably and in high performance.

In order to accomplish these objects, the present invention provides an electric field detector comprising an electric field generating member for generating an electric field, an electric field detecting circuit loop which includes a light source for generating light, an electric field detecting member for detecting change of electric field strength in said electric field generating member, and a photoelectric converting member for converting an output light signal from said electric field detecting member to an electric signal, said electric field detecting member comprising a polarizing element including a Z-cutting quartz and/or an approximate Z-cutting quartz.

BRIEF DESCRIPTION OF THE DRAWINGS

Additional objects and advantages will become apparent upon consideration of the following description when taken in conjunction with the accompanying drawings. In the accompanying drawings like parts in each of the several figures are identified by the same reference characters, and.

DETAILED DESCRIPTION OF THE PREFERRED EMBODIMENTS

Figure 1:
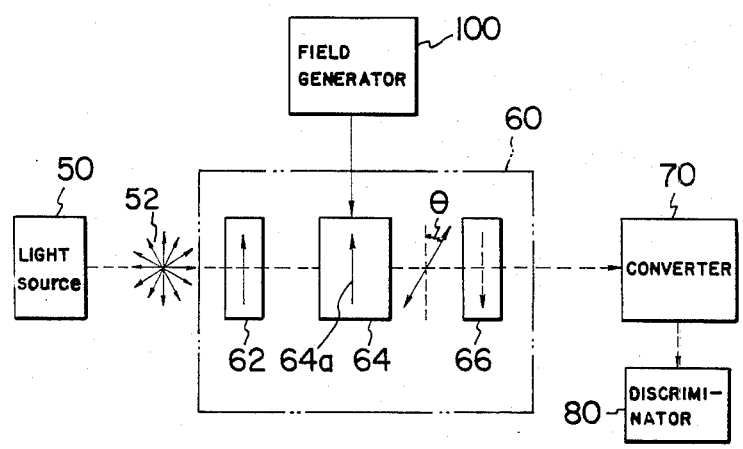
FIG. 1 is a block diagam showing an electric field detector of the prior art.
Figure 2:
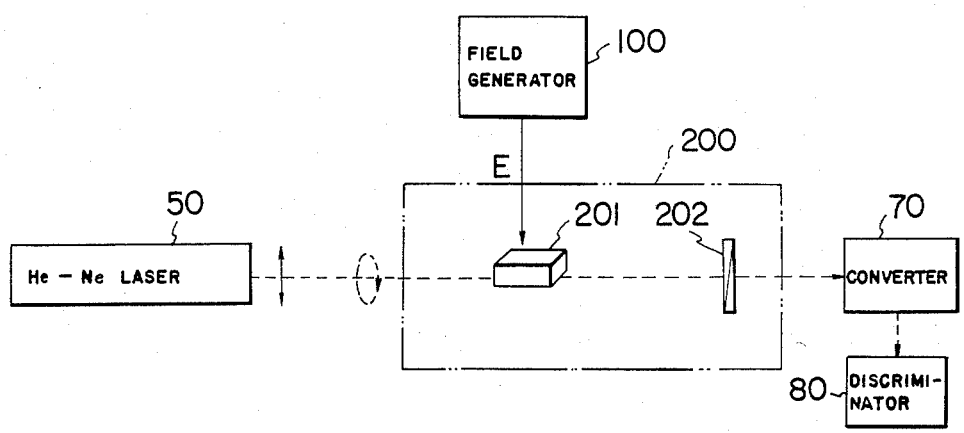
FIG. 2 is a block diagram showing an embodiment of an electric field detector of the present invention.

Referring to FIG. 2 of the drawings, there is shown an electric field detector of the present invention. The electric field detector comprises an electric field generating member 100 for generating an electric field to be tested, a light source 50 for generating light and including a He-Ne laser lamp, an electric field detecting member 200 for detecting electric field strength and for converting variation of the electric field strength to optical energy variation responsive to the electric field strength, and a photoelectric converting member 70 for converting optical energy to electrical energy supplied from the electric field detecting member 200.

Figure 3A:
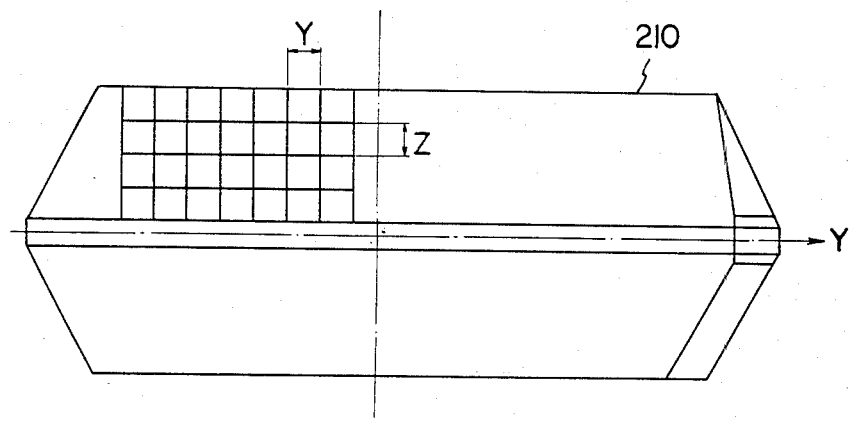
FIG. 3A is a plain view of a quartz for manufacturing a polarizing element employed in the present invention.
Figure 3B:
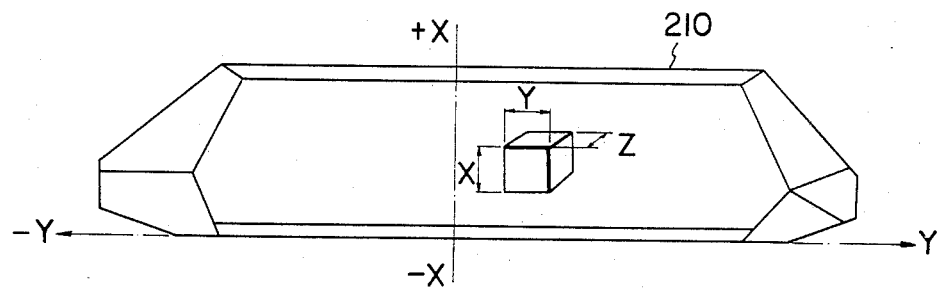
FIG. 3B is a perspective view of the quartz of FIG. 3A.

The electric field detecting member 200 comprises a Pockels cell 201 which is manufactured by Z-cutting of a quartz 210 shown in FIGS. 3A and 3B. As is shown in FIGS. 3A and 3B, the Pockels cell 201 is manufactured by cutting the quartz 210 in a vertical direction with respect to a Z-plane of the quartz 210 in order to avoid the piezoelectric phenomenon. Accordingly, the Pockels cell 201 is constructed by cutting the quartz 210 such that an optical axis is toward a Z-axis and/or approximately a Z-axis of the Pockels cell 201.

The operation of the electric field detector will be described by FIG. 2 as follows.

The light produced from the light source is supplied to the electric field detecting member 200. In the electric field detecting member 200, the light is injected to the Pockels cell 201 and an analyzer 202. An electric signal in the form of the electric field strength E is applied to the Pockels cell 201 from the electric field generating member 100. The Pockels cell 201 causes the phase angle of polarization to change. The analyzer 202 is provided such that a plane of polarization is perpendicular with respect to an optical polarizing direction. The light signal from the Pockels cell 201 is dependent upon the applied electric field strength E and is supplied to the analyzer 202.

Figure 4:
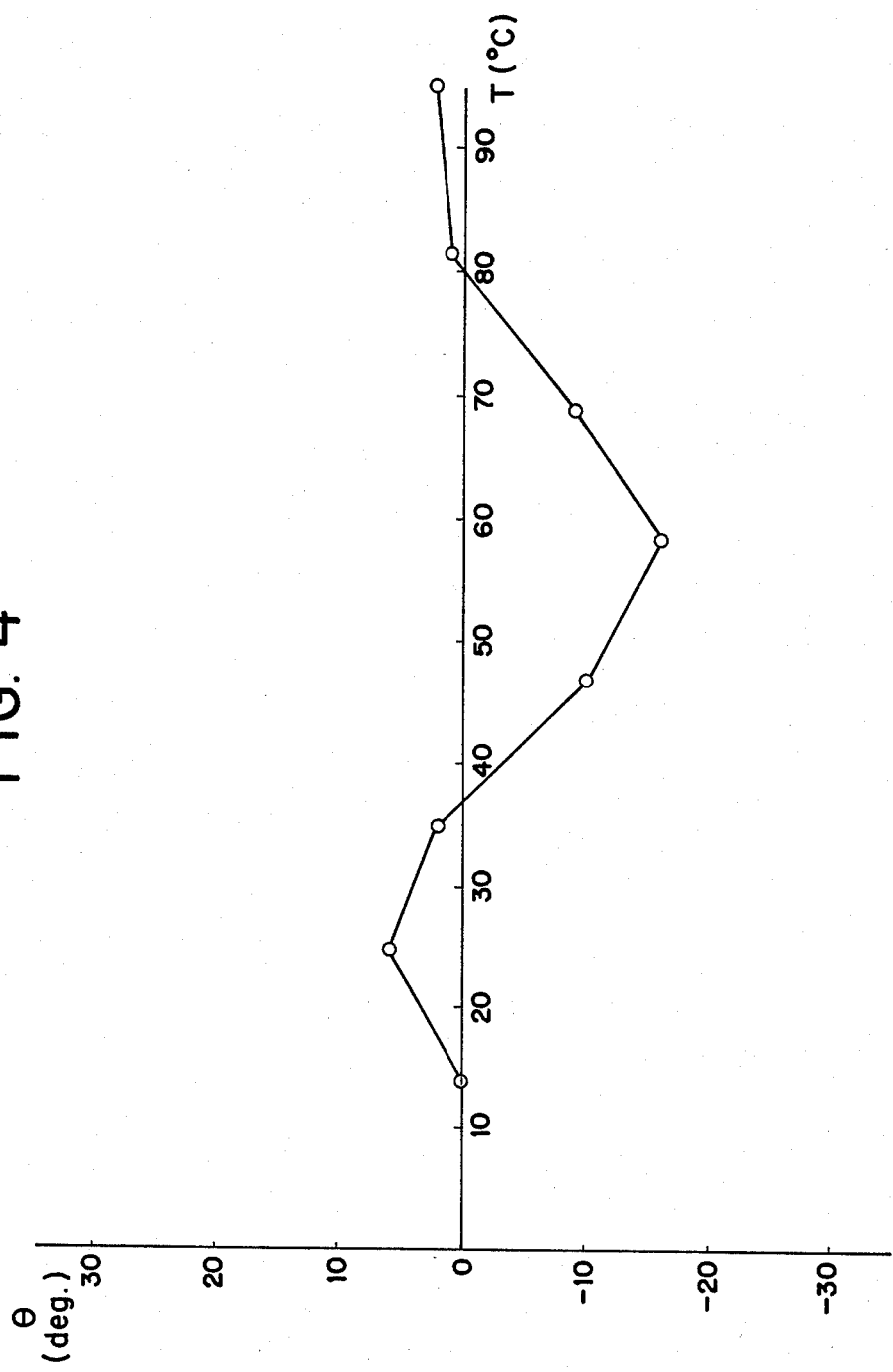
FIG. 4 is a graph showing characteristics of a quartz which is manufactured by 45°-cutting.

FIG. 4 shows characteristics of the quartz manufactured by the 45°−Z cut. As is shown in FIG. 4, the rotation of the polarizing plane varies significantly with respect to the temperature.

Figure 5:
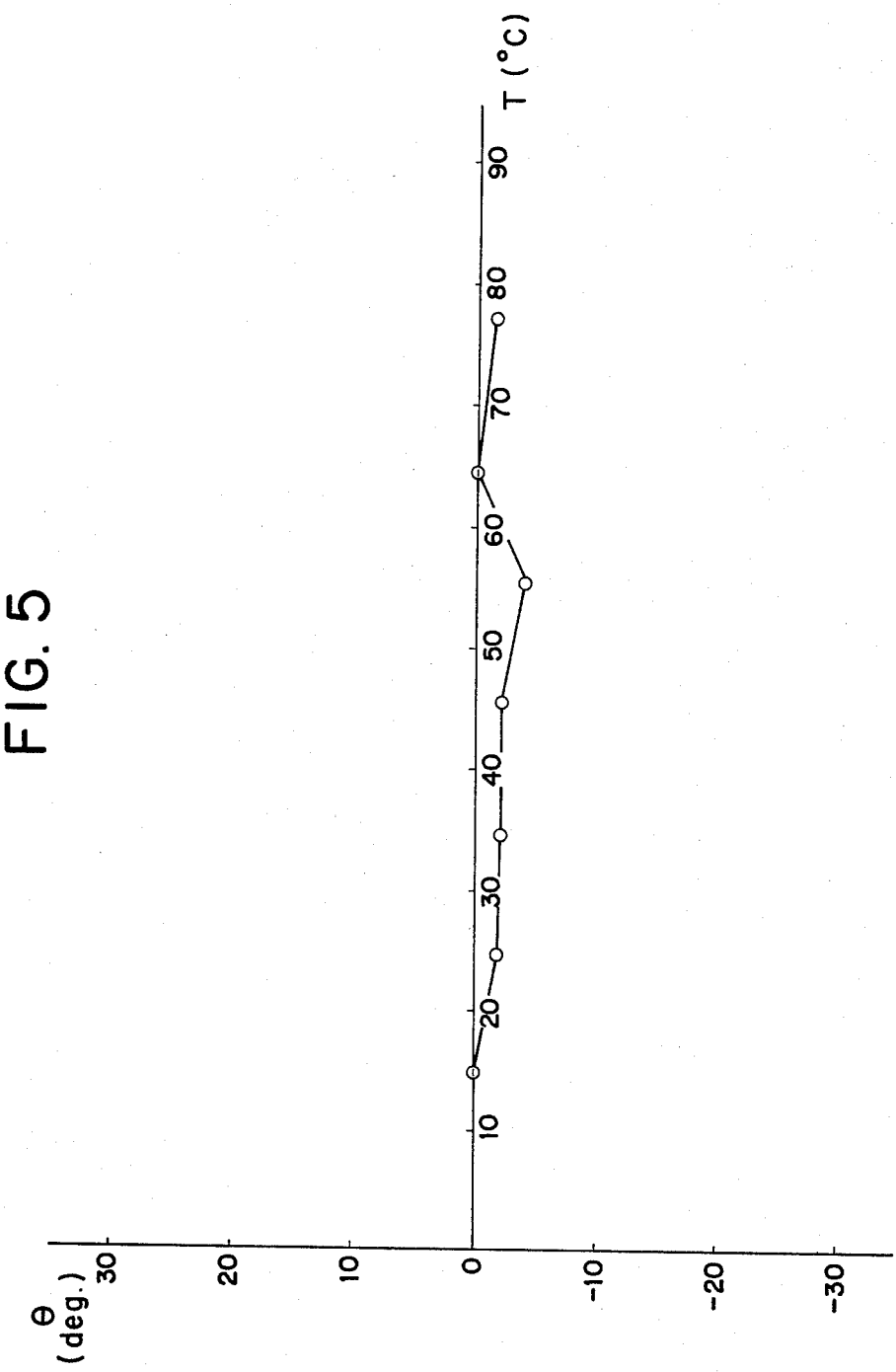
FIG. 5 is a graph showing characteristics of coupled quartz made by connecting two 45°-cutting quartz in series, each of which has the symmetrical characteristics.

FIG. 5 shows characteristics of a Pockels cell which is made by coupling two quartz elements in series and in an air-tight coupling, each of which is cut by a 45°−Z cut. As is shown in FIG. 5, the fluctuating component of the above Pockels cell is realatively small, such as about 3%. As described in the foregoing, it is, however, difficult to manufacture the Pockels cell, because high performance is required in order to adhere the two quartz elements such that an air layer is not formed therebetween and that an optical defect does not exist.

Figure 6:
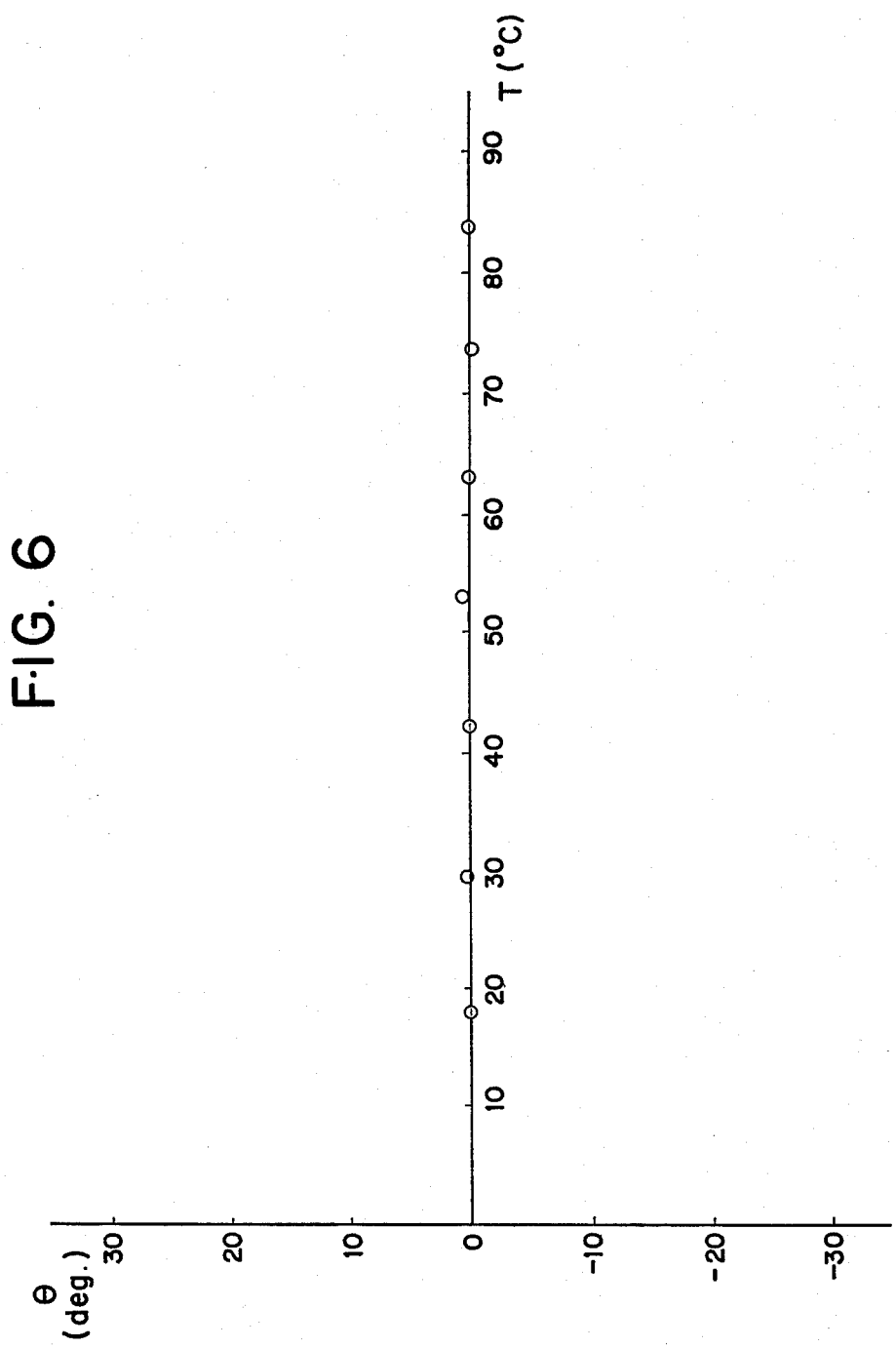
FIG. 6 is a graph showing characteristics of a quartz used in the present invention.

In accordance with the electric field detector of the present invention, the fluctuation responsive to the temperature of the polarizing plane is extremely small, as is shown in FIG. 6. FIG. 6 shows thermal characteristics of the fluctuation of the polarizing plane of the quartz which is manufactured by Z-cutting and/or approximately Z-cutting measured when the quartz is inserted into the thermal oven. As seen from FIG. 6, the fluctuation of the polarizing plane depending upon temperature variation is within a scope of the measuring error and is approximately zero. Accordingly, the output of the discriminating member 70 accurately corresponds to the change of the electric field strength E and, therefore, the a high performance and high reliability electric field detector can be obtained. Furthermore, the electric field detector is made compact, since only one of the Z-cutting or approximately Z-cutting quartz elements is employed as the Pockels cell. Additionally, a light source producing the random polarized light and a polarizer can be used instead of the laser lamp.

According to the electric field detector described above, a quantity of light transmitted by an analyzer accurately corresponds to the electric field strength since the fluctuation of the polarizing plane of the Z-cutting quartz is approximately zero against the change of the temperature, and thereby the magnitude of the electric field can be accurately detected by means of the quantity of transmitted light.

Figure 7:
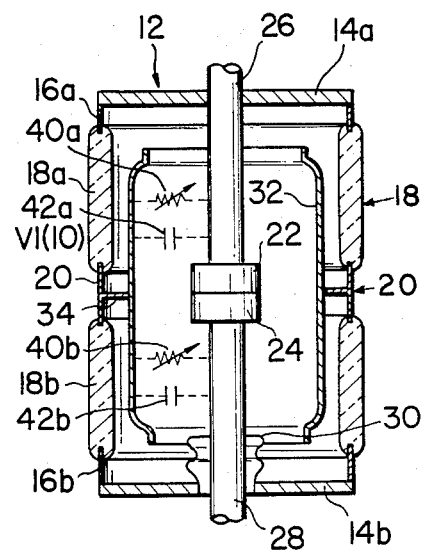
FIG. 7 is a sectional view of a vacuum circuit interrupter to be monitored by means of employing an electric field detector of the present invention.
Figure 11:
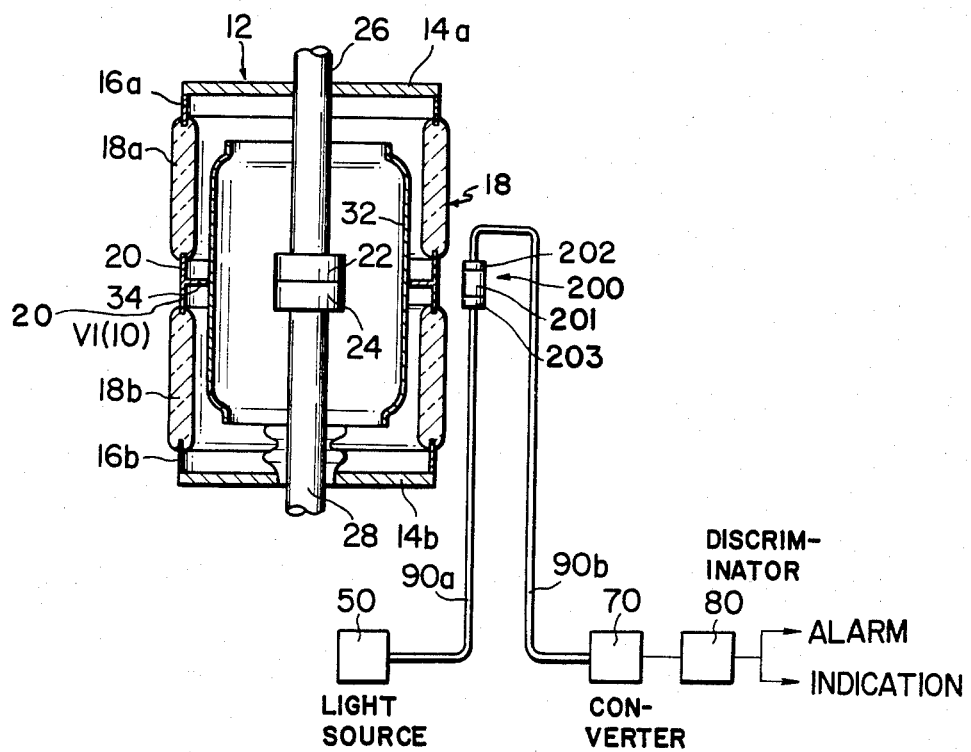
FIG. 11 is a sectional view of an embodiment of an electric field detector employing a vacuum circuit interrupter as an electric field generating member.

FIGS. 7 to 13 show an electric field detector employing an electric device of vacuum type as an electric field generating member. Particularly, the electric field detector shown in FIG. 11 is used as a pressure responsive monitoring device for a vacuum interrupter. Referring to FIG. 7 of the drawings, there is shown an electric device of vacuum type in the form of a vacuum interrupting unit VI. The vacuum interrupting unit VI comprises a highly evacuated envelope 12. This envelope 12 comprises a tubular insulating housing 18a, 18b and a pair of metallic end caps 14a and 14b located at opposite ends of the insulating housing 18a and 18b, respectively. The end caps 14a and 14b are joined to the insulating housing 18a, 18b by vacuum tight seals in the form of metallic tubes 16a and 16b.

The insulating housing comprises two tubular insulating sections 18a and 18b made of suitable glass or ceramics. Two metallic tubes 20, 16a(16b) are connected hermetically in the tubular section 18a(18b). It should be noted that the number of sections is not restricted to two, and that other embodiments of the present invention may have a different number. The tubular insulating sections are disposed colinearly and are joined together by a metallic disc 34 and two tubes 20, 20 providing hermetic seals between the insulating sections.

Disposed within the envelope 12 are two contacts movable relative to each other, shown in their fully contacted position. An upper contact 22 is a stationary contact, and a lower contact 24 is a movable contact. The stationary contact is suitably brazed to the lower end of a conductive supporting rod 26, which is integrally joined at its upper end to the metallic end cap 14a. The movable contact 24 is suitably brazed to the upper end of a conductive operating rod 28, which is vertically movable to effect opening and closing of the interrupter.

For permitting vertical motion of the operating rod 28 without impairing the vacuum inside the envelope 12, a suitable bellows 30 is provided around the operating rod 28. A tubular main shield 32 surrounds the contacts 22, 24 and protects the inner surface of the insulating sections 18a, 18b from being bombarded by arcing products.

The interrupter can be operated by driving the movable contact 24 upward and downward to close and open the electric power line. When the contacts are engaged, electric current can flow between opposite ends of the interrupter via a path comprising the operating rod 28, the movable contact 24, the stationary contact 22 and the stationary supporting rod 26.

Circuit interruption is effected by driving the contact 24 downward from the closed contacts position by a suitable operating means (not shown in the drawings). This downward motion establishes an arc between the contacts. Assuming an alternating current electric circuit, the arc persists until about the time a natural electric current zero is reached, at which time it extinguishes and is thereafter prevented from reigniting by the high dielectric strength of the vacuum. A typical arc is formed during the circuit interrupting operation. For protecting the insulating housing 18a, 18b from the metallic vapors, the main shield 32 is supported on the tublar insulating housing by means of an annular metallic disc 34. This disc 34 is hermetically jointed at its outer periphery to the central metallic tubes 20,20 and at its inner periphery to the shield 32. The shield is in turn coupled to the contacts 22, 24 and rods 26, 28 by leakage resistance 40a and 40b and stray capacitance 42a and 42b.

Figure 8:
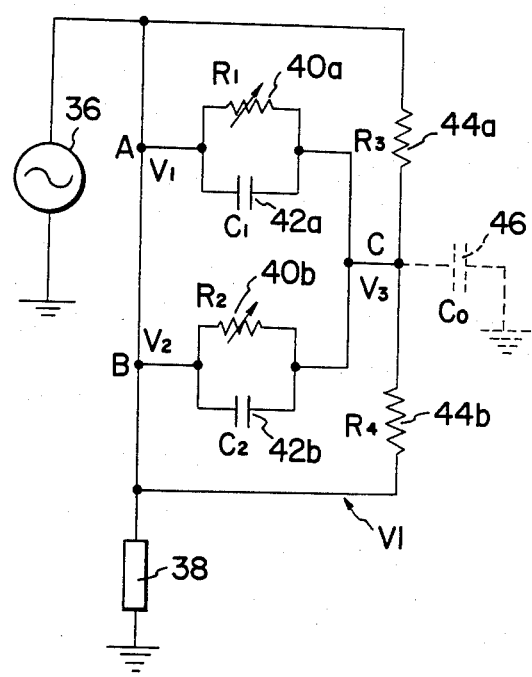
FIG. 8 is an equivalent circuit diagram of the vacuum circuit interrupter of FIG. 7.

The vacuum circuit interrupter shown in FIG. 7 is represented equivalently by a diagram shown in FIG. 8. In the diagram of FIG. 8, an electric power supply 36 is interrupted or opened by the vacuum interrupting unit VI. A variable resistor 40a shows leakage resistance between the stationary contact 22 (including the supporting rod 26) and the main shield 32. The capacitor 42a illustrates stray capacitance between the stationary contact 22 (including the supporting rod 26) and the shield 32. The variable resistor 40b represents leakage resistance existing between the movable contact 24 (including the operating rod 28) and the shield 32, and the capacitor 42b to represents stray capacitance between the movable contact 24 (including the operating rod 28) and the shield 32. Insulating sections 18a and 18b are, respectively, represented by the resistor 44a and the resistor 44b. The interrupter VI is generally connected between the electric power supply 36 and a load 38 in order to interrupt an electric load current supplied from the power supply 36 to the load 38. Stray capacitance between the main shield 32 joined to the metallic tubes 20,20 and the ground is schematically shown as a capacitor 46.

Assuming that the electric potential difference between the stationary contact 22 and the main shield 32 is $V_1$, and that the electric potential difference between the movable contact 24 and the main shield 32 is $V_2$, the electric potential difference $V_3$ between the shield 32 and ground is changed by voltage drops between points A or B and a point C. Namely, the voltage drop between the point A or B and the point C depends upon a resultant reactance component of the variable resistors 40a and 40b and capacitors 42a and 42b and an electric current component which flows between the point A or B and the point C by way of the variable resistors 40a and 40b and the capacitors 42a and 42b. It will be appreciated that the resultant reactance component depends upon vacuum pressure of the envelope 12 shown in FIG. 7. In this case, capacitance values of the capacitors 42a and 42b are constnat in spite of changes of vacuum pressure. Resistance values of the variable resistors 40a and 40b are, on the other hand, varied in accordance with the vacuum pressure inside envelope 12. Under normal operating condition the electric potential at the point C is maintained to constant. When the pressure of vacuum due to leakage or generation of metallic vapor is increased, ions and charged particles are formed in the envelope 12. By the formation of ions and charged particles, the electric leakage current flows between the contacts 22, 24 and the shield 32 because of the change in leakage resistance. Accordingly, by the loss of vacuum the electric leakage current flows from the contacts 22 and 24 to ground by way of the variable resistors 40a, 40b, and the stray capacitance 46. By this flow of the leakage current, the electric potential difference $V_3$ changes in accordance with the pressure of vacuum inside envelope 12. On the other hand, capacitance values $C_1$ and $C_2$ are approximately constant in spite of the change of vacuum pressure, because specific dielectric constant of capacitance is almost equal for all vacuum pressures of the envelope 12.

It will be obvious that the electric potential difference $V_2$ of the movable contact 24 is equal to the electric potential difference $V_1$ of the stationary contact 22, when the contacts are in the closed position. Accordingly, the electric potential difference $V_3$ of the metallic shield connected to the metallic tubes 20,20 changes in accordance with the leakage resistance values between contact 22 or 24 and the shield 32. Moreover, the electric potential difference $V_3$ at the tubes 20,20 is changed by the capacitance value of the stray capacitance 46 between main shield 32 and ground.

The interior of the envelope 12 is usually maintained to be highly evacuated at pressures in the range of $10^{-7}$ Torr to $10^{-4}$ Torr. When the vacuum interrupter has the proper vacuum pressure, the electric potential at the main shield 32 is maintained constant, as is shown by the experimental data of FIG. 10. In the data shown in FIG. 10, a curve $l_o$ shows the electric potential differences $V_1$, $V_2$ and $V_3$ when the vacuum interrupter has the proper vacuum. A curve $l_1$ shows the electric potential differences $V_1$ and $V_2$ when the vacuum pressure is increased. Further, the curves $l_{2a}$ and $l_{2b}$ are illustrative of electric field strength at a position spaced apart from the vacuum circuit interrupter in the vicinity of the tubular main shield 32.

Figure 9:
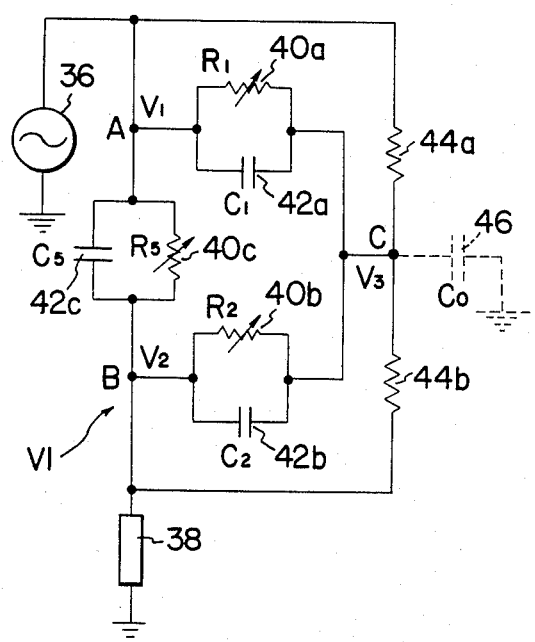
FIG. 9 is an equivalent circuit diagram of the vacuum circuit interrupter when its contacts are in an opened position.
Figure 10:
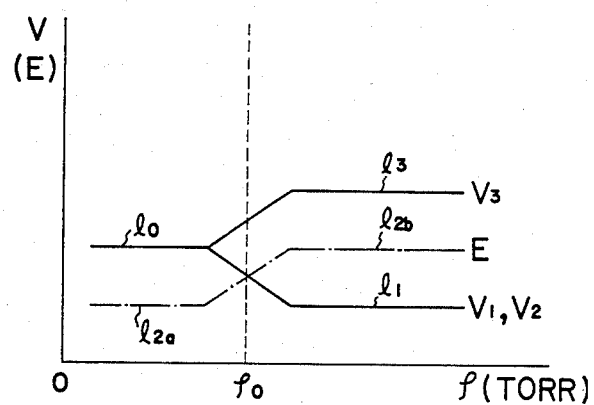
FIG. 10 is a characteristic diagram showing the relationship between the pressure of vacuum circuit interrupter and an electric field strength and potential at the interrupter.

FIG. 9 shows an equivalent diagram of the vacuum interrupting unit VI when the contacts 22 and 24 are in an opened position. In FIG. 9, a variable resistor 40C represents leakage resistance between the stationary contact 22 and the movable contact 24, and a capacitor 42c represents stray capacitance between the stationary contact 22 and the movable contact 24. The leakage resistance between contacts also varies in accordance with the vacuum pressure of the envelope 12. Accordingly, it will be apparent that the electric potential difference $V_3$ at the tubular main shield 32 varies responsive to the vacuum pressure in the envelope 12 as in FIG. 8, because the electric potential difference of each portion of the interrupter changes in accordance with the leakage current inside the envelope 12.

Referring now particularly to FIG. 11, the electric field detector for vacuum circuit interrupter is shown in greater detail. The electric field detector 200 comprises an electric field generating member in the form of a vacuum circuit interrupter to be tested, a light source 50 for generating light, an electric field detecting member 200 for detecting electric field and for converting variation of the electric field strength to optical energy variation responsive to the electric field strength, a photoelectric converting member 70 for converting optical energy supplied by the electric field detecting member to electric energy, and a vacuum pressure change discriminating circuit 80 for discriminating the vacuum pressure change and outputting an electric signal.

In more detail, the light source is provided with a light emitting diode generating light in accordance with electric current flowing thereto. The electric field detecting member 200 is disposed on and/or in the vicinity of an electric field generating member in the form of the vacuum circuit interrupter having the main shield 32. The electric field detecting member 200 is interconnected with the light source 50 by a light guide tube in the form of an optical fiber 90a. The electric field detecting member 200 comprises a polarizer 203, an electric field sensitive element in the form of a Pockels cell 201 made of a Z-cutting quartz and/or an approximately Z-cutting quartz and an analyzer 202. The polarizer 203 is connected to the light source 50 by the optical fiber 90a. The Pockels cell 201 is arranged to be located between polarizer 203 and the analyzer 202. The analyzer 202 is connected to the photo-electric converting member 70 by a light guiding tube in the form of an optical fiber 90b. The vacuum pressure change discriminating member 80 is electrically connected to the photo-electric converting member 70, and an electrical output signal is employed as an alarm signal, an indicating signal and the like.

The operation of the pressure responsive monitoring device will be described by means of FIGS. 11, 12 and 13 as follows.

Figure 12:
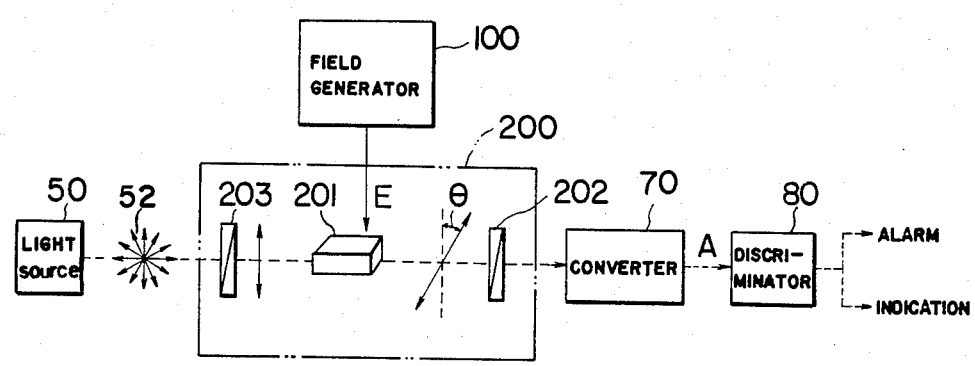
FIG. 12 is a block diagram of an embodiment of an electric field detector in accordance with the present invention.

As is shown in FIG. 12, the light produced by the light source 50 is a random polarized light 52. The random polarized light 52 is supplied to the electric field detecting member 200 by way of the optical fiber 90a. In the electric field detecting member 200, the random light 52 is polarized by the polarizer 203 to produce a linearly polarized light. The direction of polarization of the linearly polarized light is shown by an arrow. The linearly polarized light is applied to the Pockels cell 201 made of a Z-cutting quartz and/or an approximately Z-cutting quartz. An electric signal in the form of electric field strength E is applied to the Pockels cell 201 by the electric signal generating member 100 in the form of the vacuum circuit interrupter VI. The Pockels cell 201 causes the direction of polarization to change. The analyzer 202 is provided such that a plane of polarization is perpendicular and/or approximately rectangular with respect to an optical polarizing direction. The electric field strength to be applied to the Pockels cell 201 is determined by the change of vacuum pressure of the interrupter. The characteristics of the light from the Pockels cell 201 are dependent upon the applied electric field strength E and are supplied the analyzer 202.

Figure 13:
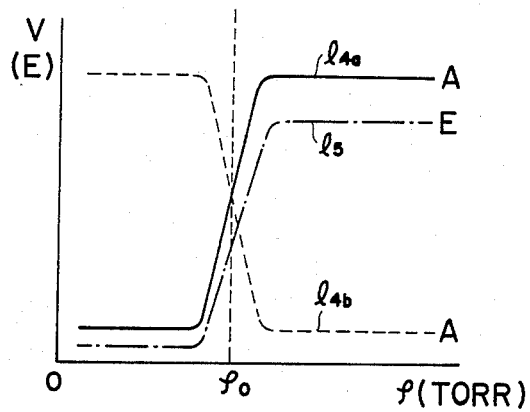
FIG. 13 is a characteristic diagram showing the relationship between the pressure of vacuum and output signals in the device of FIG. 11.

When the vacuum pressure is proper, the electric field strength E is low, as is shown by a curve $l_{4a}$ of FIG. 13 and, on the other hand, the electric field strength E becomes high when the vacuum pressure increases. A phase angle $\theta$, representing the change in direction of polarization provided by cell 201, changes in accordance with the applied electric field strength which corresponds to the change of vacuum pressure of the vacuum interrupting unit VI. The angle $\theta$ is set so as to be zero when the vacuum pressure is proper and becomes large, when the vacuum is lost. Consequently, the quantity of light passed to converter 70 is high in case of the loss of vacuum and, therefore, output signal A of the converter 70 increases, as is shown by curve $l_{4a}$ of FIG. 13. Additionally, a curve $l_{4b}$ shown in FIG. 13 is characteristic of the output of the converter 70 when the analyzer 202 is provided such that the plane of polarization assumes a parallel relationship with respect to that of the polarizer 203.

The vacuum pressure change discriminating member 80 activates in accordance with the output signal A of the photo-electric converting member 70 to annunciate the loss of vacuum.

Although the loss of vacuum is detected by means of sensing the variation of the electric potential difference in the vicinity of the tubular main shield in the monitoring device described above, it is possible to detect the loss of vacuum, by sensing the variation of the electric field strength in other portions of the envelope of the vacuum circuit interrupter. Moreover, it is appreciated that other electrical devices of the type to be monitored can be used.

According to the monitoring device of the above embodiment, the vacuum pressure change can be monitored in a non-contacting condition without changing the structure of the vacuum circuit interrupter. Since insulation between the high voltage portion of the vacuum circuit interrupter and the electric field detecting member can be easily provided, monitoring of the vacuum pressure change can be performed in all voltage ranges of the interrupter.

Since a high voltage device in the form of the interrupting unit VI in accordance with the invention is isolated from a low voltage device such as a measuring circuit by light coupler, it is easy to monitor operation of the high voltage device. Since the electric field detecting member is constructed of an insulating material such as an analyzer, a Pockels cell made of a Z-cutting quartz and/or an approximately Z-cutting quartz and a polarizer and the like, high reliability is obtained. Detection of the change of vacuum pressure is performed by the optical device, and thereby a high performance monitoring device can be obtained because the device is free from an electrical noise.

Moreover, according to the embodiment described above, the vacuum pressure detector element is located adjacent to the electric field generating portion of the vacuum circuit interrupter. Thus, the vacuum pressure change within the envelope is detected by means of the optical device. With this arrangement the change of the electric field strength due to the change of vacuum pressure can be applied to the electric field detecting member. Therefore, the electric field detecting member converts the electric field strength to a quantity of light energy. The quantity of light energy is converted to the electric energy quantity by means of the photo-electric converting means.

While we have shown and described particular embodiments of the present invention, it will be obvious to those skilled in the art that changes and modifications may be made therein without departing from the invention in its broader aspects, and we, therefore, intended in the appended claims to cover all such changes and modifications as fall within the true and scope of the invention.

What is claimed is:

1. An electric field detector comprising:
   (a) an electric field generating means for generating an electric field,
   (b) a light source for generating light,
   (c) an electric field detecting means for detecting change of electric field strength in said electric field generating means,
   (d) a photoelectric converting means for converting an output light signal from said electric field detecting means to an electric signal,
   (e) a discriminating means for discriminating changes in the electric field strength of the electric field generating means, and
   (f) said electric field detecting means being provided in the vicinity of said electric field generating means, said electric field detecting means optically connected to both said light source and said photoelectric converting means, and said discriminating means being electrically connected to said photoelectric converting means,
   (g) said electric field detecting means comprising an electric field-sensitive means for transmitting linearly polarized light from said light source in a Z-direction and/or approximately in a Z-direction of a quartz crystal and for changing the phase difference between two specific oscillations in said quartz crystal, and
   (h) said electric field-sensitive means comprising a Pockels cell made from Z-cut quartz and/or approximately-z-cut quartz.

2. An electric field detector as claimed in claim 1 wherein said electric field detecting means further comprises, at least, an analyzing means for analyzing output light from the electric field-sensitive means.

3. An electric field detector as claimed in claim 2 wherein said electric field detecting means further comprises a polarizing means for polarizing the light from said light source, and an electric field responsive means for changing the angle of polarization of light polarized by said polarizing means.

4. An electric field detector as claimed in claim 2 wherein said photoelectric converting means is connected to said analyzer means by an optical fiber.

5. An electric field detector as claimed in claim 1, wherein said electric field generating means comprises a vacuum circuit interrupter.

6. An electric field detector as claimed in claim 5, wherein said discriminating means comprises a vacuum pressure change discriminating member for discriminating changes in vacuum pressure within an envelope of the vacuum circuit interrupter in response to the electric signal from said photoelectric converting means.

7. An electric field detector as claimed in claim 6, wherein said polarizing means of said electric field detecting means is connected to the light source by an optical fiber.

8. An electric field detector as claimed in claim 6 wherein said electric field detecting means comprises, at least, said polarizing means for polarizing the light incident from said light source, and an electric field responsive means for changing the angle of polarization of light polarized by said polarizing means.

9. An electric field detector as claimed in claim 5 wherein said electric field-sensitive means of the electric field detecting means is separated from a part of an envelope of the vacuum circuit interrupter by a predetermined distance in which the electric field strength is responsive to changes in the vacuum pressure inside the envelope.

10. An electric field detector as claimed in claim 9 wherein said vacuum circuit interrupter of the electric field generating means further comprises a pair of separable contacts within said envelope adapted to be connected in series with an electric power circuit, a metal shield surrounding the contacts and shielding the envelope against metal deposits, tubular flanges, and a disk for supporting said metal shield.

11. An electric field detector as claimed in claim 10 wherein said electric field detecting means is separated from said metal shield by a predetermined distance.

* * * * *